United States Patent
Yang

(10) Patent No.: US 11,294,218 B2
(45) Date of Patent: Apr. 5, 2022

(54) ARRAY SUBSTRATE AND ITS MAUFACTURING METHOD, LIQUID CRYSTAL DISPLAY PANEL AND ITS MANUFACTURING METHOD

(71) Applicants: HKC Corporation Limited, Shenzhen (CN); Chongqing HKC Optoelectronics Technology Co., ltd., Chongqing (CN)

(72) Inventor: ChunHui Yang, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 16/772,819

(22) PCT Filed: Sep. 11, 2018

(86) PCT No.: PCT/CN2018/105062
§ 371 (c)(1),
(2) Date: Jun. 15, 2020

(87) PCT Pub. No.: WO2019/119889
PCT Pub. Date: Jun. 27, 2019

(65) Prior Publication Data
US 2021/0165268 A1    Jun. 3, 2021

(30) Foreign Application Priority Data

Dec. 21, 2017 (CN) .......................... 201711391928.7

(51) Int. Cl.
*G02F 1/1335* (2006.01)
*G02F 1/1362* (2006.01)
(Continued)

(52) U.S. Cl.
CPC ...... *G02F 1/133512* (2013.01); *G02F 1/1339* (2013.01); *G02F 1/1368* (2013.01);
(Continued)

(58) Field of Classification Search
None
See application file for complete search history.

(56) References Cited

U.S. PATENT DOCUMENTS 5,121,237 A * 6/1992 Ikeda ................ G02F 1/136209
349/110
2008/0068537 A1* 3/2008 Lee .................... G02F 1/136209
349/106
(Continued)

FOREIGN PATENT DOCUMENTS

CN    105842904 A    8/2016
CN    107132710 A    9/2017

*Primary Examiner* — Shan Liu
(74) *Attorney, Agent, or Firm* — WPAT, PC

(57) ABSTRACT

An array substrate includes: a substrate; a black light-shading layer disposed on the substrate; a first metal layer correspondingly disposed on the black light-shading layer and thereby the black light-shading layer being located between the substrate and the first metal layer; an active material layer disposed on the first metal layer; a second metal layer disposed on the active material layer; a passivation layer disposed on the second metal layer and with a contact hole; a color filter layer disposed on the passivation layer; and a pixel electrode layer disposed on the color filter layer and connected to the second metal layer through the contact hole. Moreover, a liquid crystal display panel and a manufacturing method of an array substrate also are provided.

5 Claims, 5 Drawing Sheets

(51) Int. Cl.

| | |
|---|---|
| *G02F 1/1333* | (2006.01) |
| *G02F 1/1339* | (2006.01) |
| *G02F 1/1343* | (2006.01) |
| *G02F 1/1368* | (2006.01) |
| *H01L 27/12* | (2006.01) |
| *H01L 29/786* | (2006.01) |

(52) U.S. Cl.
CPC .... G02F 1/13439 (2013.01); G02F 1/133345 (2013.01); G02F 1/134309 (2013.01); G02F 1/136222 (2021.01); H01L 27/124 (2013.01); H01L 27/1222 (2013.01); H01L 27/1248 (2013.01); H01L 27/1255 (2013.01); H01L 27/1288 (2013.01); H01L 29/78669 (2013.01)

(56) References Cited

U.S. PATENT DOCUMENTS

| | | | |
|---|---|---|---|
| 2009/0273752 A1* | 11/2009 | Kimura | G02F 1/136227 |
| | | | 349/139 |
| 2009/0284449 A1* | 11/2009 | Lee | H01L 27/1225 |
| | | | 345/76 |
| 2011/0273651 A1* | 11/2011 | Kim | H01L 27/12 |
| | | | 349/110 |
| 2014/0151708 A1* | 6/2014 | Jeon | H01L 29/66969 |
| | | | 257/72 |
| 2015/0236047 A1* | 8/2015 | Kim | G06F 3/0446 |
| | | | 345/174 |
| 2018/0203313 A1* | 7/2018 | Wang | G02F 1/136286 |
| 2019/0051677 A1* | 2/2019 | Liu | H01L 29/401 |
| 2019/0113817 A1* | 4/2019 | Wang | G02F 1/136286 |

* cited by examiner

ARRAY SUBSTRATE AND ITS MAUFACTURING METHOD, LIQUID CRYSTAL DISPLAY PANEL AND ITS MANUFACTURING METHOD

FIELD OF THE DISCLOSURE

The disclosure relates to the field of display technology, and more particularly to an array substrate and a manufacturing method thereof, and a liquid crystal display panel and a manufacturing method thereof.

BACKGROUND

In the actual production process of an exemplary COT (color on TFT) type LCD device, especially during an array substrate prepared by all related processes and a counter substrate prepared by all related processed are assembled together and then as a whole are cut into small pieces, a shift of relative positions between a BM (black matrix) on the counter substrate and a data line would be occurred very easily, and when the shift exceeds a certain range, for example, when the shift of the BM exceeds the SM (shielding metal), it would easily cause the light leakage between the SM and the data line and yield of product is reduced consequently. Although an attempt of increasing a width of the BM on the counter substrate certainly has an effect, it would reduce the transmittance of product.

SUMMARY

Accordingly, embodiments of the disclosure provide an array substrate and a manufacturing method thereof, and a liquid crystal display panel and a manufacturing method thereof, which are capable of effectively suppressing the occurrence of light leakage phenomenon at a side(s) of the data line.

In particular, an array substrate provided by the disclosure includes: a substrate; a black light-shading layer, disposed on the substrate; a first metal layer, correspondingly disposed on the black light-shading layer, wherein the black light-shading layer is located between the substrate and the first metal layer; an active material layer, disposed on the first metal layer; a second metal layer, disposed on the active material layer; a passivation layer, disposed on the second metal layer and with a contact hole; a color filter layer, disposed on the passivation layer; and a pixel electrode layer, disposed on the color filter layer and connected to the second metal layer through the contact layer.

In an embodiment of the disclosure, the first metal layer includes a gate electrode of an active switching element and a shielding metal for forming a storage capacitor with the pixel electrode layer;

In an embodiment of the disclosure, the active material layer includes a gate insulating layer, a semiconductor layer and an ohmic contact layer of the active switching element; the gate insulating layer, the semiconductor layer and the ohmic contact layer are sequentially stacked in that order;

In an embodiment of the disclosure, the second metal layer includes a source electrode of the active switching element, a drain electrode of the active switching element connected to the pixel electrode layer, and a data line connected to the source electrode;

In an embodiment of the disclosure, the color filter layer includes a red filter block, a green filter block and a blue filter block; and the pixel electrode layer includes a plurality of pixel electrodes made of a transparent electrically-conductive material, and the pixel electrodes are corresponding to the red filter block, the green filter block and the blue filter block in one-to-one manner.

In an embodiment of the disclosure, the shielding metal disposed surrounding the pixel electrode and being partially overlapped with two edge portions of the pixel electrode parallel to the data line, and the shielding metal and the data line have a gap existed therebetween in a direction perpendicular to the data line.

In an embodiment of the disclosure, a material of the black light-shading layer is a black photoresist containing carbon black.

A liquid crystal display panel provided by another embodiment of the disclosure includes: the array substrate as described in any one of the preceding embodiments; a counter substrate, disposed opposite to the array substrate; a liquid crystal layer, disposed between the array substrate and the counter substrate; and a sealant, disposed between the array substrate and the counter substrate and enclosing the liquid crystal layer. The counter substrate includes: a second substrate; a black matrix layer, disposed at a side of the second substrate facing towards the array substrate; and a common electrode layer, disposed at a side of the black matrix layer facing towards the array substrate;

In an embodiment of the disclosure, a material of the black light-shading layer is same as a material of the black matrix layer.

A manufacturing method of an array substrate provided by still another embodiment of the disclosure includes steps of: forming a black light-shading layer and a first metal layer on a substrate, wherein the black light-shading layer is located between the substrate and the first metal layer; forming an active material layer on the first metal layer; forming a second metal layer on the active material layer; forming a passivation layer on the second metal layer and forming a contact hole in the passivation layer; forming a color filter layer on the passivation layer; and forming a pixel electrode layer on the color filter layer and making the pixel electrode layer connect to the second metal layer through the contact hole.

In an embodiment of the disclosure, the black light-shading layer and the first metal layer are formed by a same masking process.

In an embodiment of the disclosure, the step of forming a black light-shading layer and a first metal layer on a substrate and wherein the black light-shading layer is located between the substrate and the first metal layer includes: forming a black light-shading material layer on the substrate; forming a metal material layer on the black light-shading material layer; forming a photoresist material layer on the metal material layer; using a photomask to perform exposure and developing onto the photoresist material layer, to obtain a patterned photoresist material layer; using the patterned photoresist material layer as a mask to sequentially perform a wet etching and a dry etching respectively onto the metal material layer and the black light-shading material layer; and removing residual photoresist material layer after the dry etching, to obtain the black light-shading layer and the first metal layer.

In an embodiment of the disclosure, the step of forming a black light-shading layer and a first metal layer on a substrate and wherein the black light-shading layer is located between the substrate and the first metal layer includes: forming a gate electrode of an active switching element and a shielding metal for forming a storage capacitor with the pixel electrode layer, on the black light-shading layer; wherein the gate electrode and the shielding metal are parts of the first metal layer.

In an embodiment of the disclosure, the step of forming an active material layer on the first metal layer includes: sequentially forming a gate insulating layer, a semiconductor layer and an ohmic contact layer of the active switching element on the first metal layer.

In an embodiment of the disclosure, the step of forming a second metal layer on the active material layer includes: forming a source electrode of the active switching element, a drain electrode of the active switching element connected to the pixel electrode layer and a data line connected to the source electrode on the active material layer; wherein the source electrode, the drain electrode and the data line are parts of the second metal layer.

In an embodiment of the disclosure, the step of forming a color filter layer on the passivation layer includes: forming a red filter block, a green filter block and a blue filter block as per a predetermined order on the passivation layer.

In an embodiment of the disclosure, the step of forming a pixel electrode layer on the color filter layer includes: forming a plurality of pixel electrodes on the color filter layer corresponding to the red filter block, the green filter block and the blue filter block in one-to-one manner; wherein the pixel electrodes are made of a transparent electrically-conductive material.

In an embodiment of the disclosure, a material of the black light-shading layer is a black photoresist containing carbon black.

The disclosure may have the following advantages that: the embodiments of the disclosure manufacture the black light-shading layer on the array substrate, on the basis of simplifying manufacture complexity and ensuing transmittance of product, which can effectively suppress the light leakage phenomenon caused by the black matrix layer on the counter substrate cannot block light between the data line and the shielding metal resulting from the shift of relative position between the black matrix layer on the counter substrate and the data line.

BRIEF DESCRIPTION OF THE DRAWINGS

In order to more clearly illustrate technical solutions of embodiments of the disclosure, drawings to be used in the description of the embodiments will be briefly described. Apparently, the drawings in the description below are merely some embodiments of the disclosure, a person skilled in the art can obtain other drawings according to these drawings without creative efforts.

DETAILED DESCRIPTION OF EMBODIMENTS

Technical solutions in embodiments of the disclosure will be clearly and completely described below in conjunction with accompanying drawings of the disclosure. Apparently, the described embodiments are only some of embodiments of the disclosure rather than all of the embodiments. Based upon the described embodiments, all other embodiments obtained by a person skilled in the art without creative effects should be within the scope of protection of the disclosure.

Figure 1:
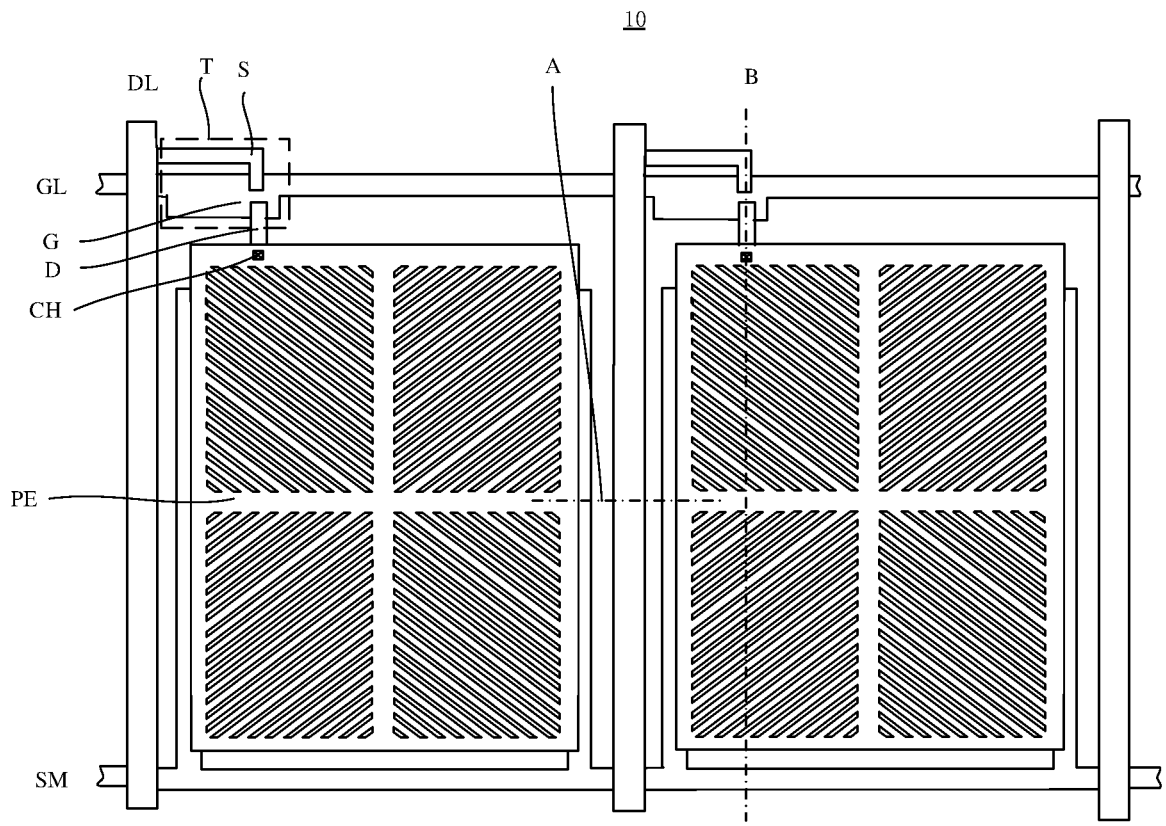
FIG. 1 is a schematic structural view of an array substrate according to an embodiment of the disclosure.

Referring to FIG. 1, an array substrate 10 provided by an embodiment of the disclosure includes: data lines DL, a scan line GL, an active switching element T, pixel electrodes PE and a shielding metal SM. The data lines DL and the scan line GL for example are disposed intersecting with each other to form multiple regions, and each of the regions has one pixel electrode PE disposed therein. The active switching element T includes a source electrode S, a drain electrode D and a gate electrode G. The source electrode S is electrically connected to the data line DL, the pixel electrode PE is electrically connected to the drain electrode D through a contact hole CH, and the gate electrode G is electrically connected to the scan line GL. The shielding metal SM for example is disposed surrounding the pixel electrode PE and being partially overlapped with two edge portions (left and right edges in FIG. 1) of the pixel electrode PE parallel to the data line DL to thereby form a storage capacitor. Moreover, the shielding metal SM and the data line DL have a gap existed therebetween in a direction (e.g., horizontal direction in FIG. 1) perpendicular to the data line DL. More specifically, the source electrode S, the drain electrode D and the data lines DL for example are located in a same layer structure (also referred to as in a same level), the data lines DL and the scan line GL for example are made of an opaque electrically-conductive metal material. The opaque electrically-conductive metal material for example is chromium or other opaque electrically-conductive metal material, and can be used as a light-shading structure cooperative with a black light-shading material to achieve better light-shading effect, so that light striking on the opaque electrically-conductive metal material can be completely blocked. The pixel electrode PE for example is made of a transparent electrically-conductive metal material. The transparent electrically-conductive metal material for example is an ITO (indium tin oxide) film material. The ITO film has high conductivity, high transmittance of visible light, high mechanical hardness and good chemical stability. The pixel electrode PE for example is multiple in quantity.

Figure 2A:
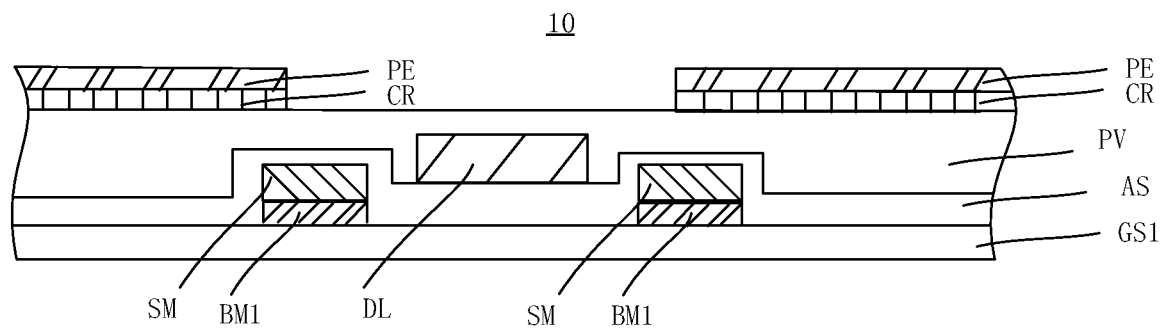
FIG. 2A is a schematic structural view of the array substrate taken along a cross-section line A in FIG. 1.

FIG. 2A is a schematic structural view of the array substrate 10 taken along the cross-section line A in FIG. 1. As seen from FIG. 2A, the array substrate 10 further includes a substrate (also referred to as base) GS1, a black light-shading layer constituted by black light-shading blocks BM1, an active material layer AS, a passivation layer PV, and a color filter layer including color filter blocks CR of multiple colors. The black light-shading blocks BM1 are disposed on the substrate GS1. The shielding metals SM are located in a layer structure on the black light-shading blocks BM1, so that the black light-shading blocks BM1 are located between the substrate GS1 and the respective shielding metals SM. The active material layer AS is located in a layer structure between the shielding metals SM and the data line DL, the passivation layer PV is located in a layer structure between the data line DL and the color filter layer, the pixel electrodes PE are located in a layer structure on the color filter layer. The substrate GS1 for example is made of a transparent glass material. The shielding metals SM for example are correspondingly disposed with the respective black light-shading blocks BM1 on the bottom thereof. The black light-shading blocks BM1 for example are made of a black opaque insulating material. The black opaque insulating material for example is a black photoresist containing carbon black. The gate electrode G also s is correspondingly disposed with the black light-shading block BM1 (see FIG. 2B) on the bottom thereof. The scan line GL also is correspondingly disposed with the black light-shading block BM1 on the bottom thereof (not shown). These black light-shading blocks BM1 cooperative with a black matrix material on a counter substrate opposite to the array substrate 10 can achieve better light-shading effect, so as to suppress the occurrence of light leakage phenomenon caused by the portion between the data line and the shielding metal being not completely covered by the black matrix material on the counter substrate resulting from that the counter substrate and the array substrate 10 are not well aligned with each other in a manufacturing process of a liquid crystal display panel. More specifically, the color filter layer containing the color filter blocks CR of multiple colors for example includes a red filter block CR, a green filter block CR and a blue filter block CR. The red filter block CR, the green filter block CR and the blue filter block CR are disposed corresponding to multiple pixel electrodes PE in one-to-one manner. For example, one pixel electrode PE is corresponding to one red filter block CR, or one pixel electrode PE is corresponding to one green filter block CR, or one pixel electrode PE is corresponding to one blue filter block CR. FIG. 2A shows the active material layer AS rightly above the shielding metal SM for example only includes a gate insulating layer GI (see FIG. 2B) of the active switching element T.

Figure 2B:
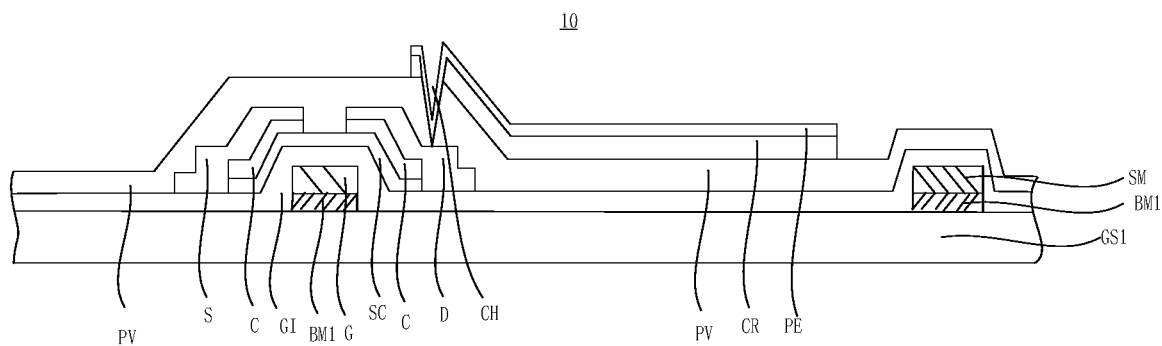
FIG. 2B is a schematic structural view of the array substrate taken along a cross-section line B in FIG. 1.

FIG. 2B is a schematic structural view of the array substrate 10 taken along the cross-section line B in FIG. 1. As seen from FIG. 2B, the active material layer AS (shown in FIG. 2A) rightly above the gate electrode G not only includes the gate insulating layer GI of the active switching element T, but also includes a semiconductor layer SC and an ohmic contact layer C of the active switching element T. The gate insulating layer GI, the semiconductor layer SC and an ohmic contact layer C are sequentially staked in that order. The passivation layer PV is disposed with a contact hole CH therein, and the pixel electrode PE is electrically connected to the drain electrode D through the contact hole CH. More specifically, the source electrode S and the drain electrode D shown in FIG. 2B and the data line DL shown in FIG. 2A are located in a same level; the shielding metals SM, the gate electrode G and the scan line GL (not shown in FIG. 2A and FIG. 2B) for example also are located in a same level; the semiconductor layer SC for example is made of α-Si (amorphous silicon) material; and the gate insulating layer GI and the passivation layer PV for example are made of a silicon nitride material.

Figure 3A:
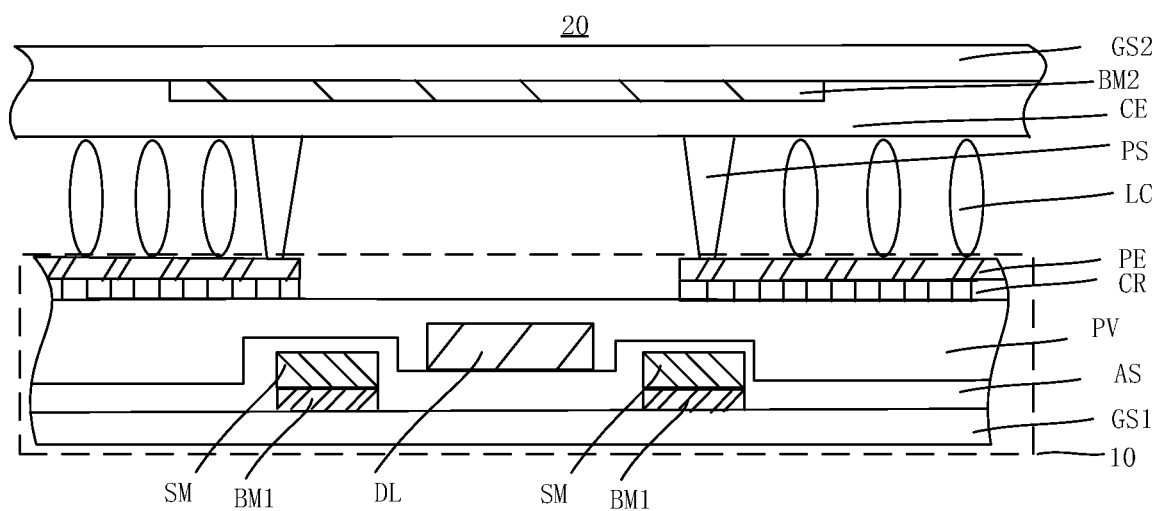
FIG. 3A is a schematic structural view of a liquid crystal display panel taken along the cross-section line A in FIG. 1.
Figure 3B:
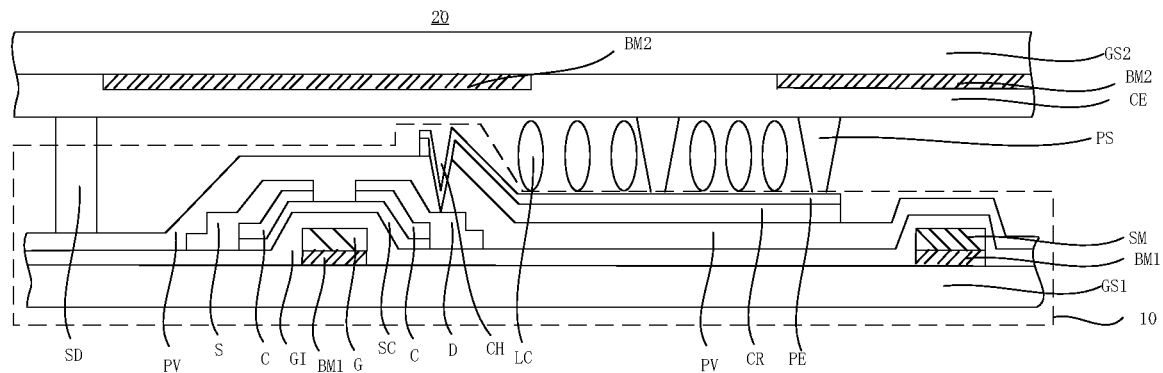
FIG. 3B is a schematic structural view of the liquid crystal display panel taken along the cross-section line B in FIG. 1.

Referring to FIG. 3A and FIG. 3B, an embodiment of the disclosure provides a liquid crystal display panel 20, FIG. 3A is a schematic structural view of the liquid crystal display panel 20 taken along the cross-section line A in FIG. 1, and FIG. 3B is a schematic structural view of the liquid crystal display panel 20 taken along the cross-section line B in FIG. 1. As seen from FIGS. 3A and 3B, the liquid crystal display panel 20 includes: the array substrate 10 as described in any one of the foregoing embodiments, a counter substrate disposed opposite to the array substrate 10, a sealant SD, photo spacers PS, and a liquid crystal layer LC containing multiple liquid crystal molecules and surrounded by the sealant SD. The sealant SD, the photo spacers PS and the liquid crystal layer LC are disposed between the counter substrate and the array substrate 10. The counter substrate includes a substrate (also referred to as base) GS2, a black matrix block BM2 located at a side of the substrate GS2 facing towards the array substrate 10, and a common electrode layer CE located at a side of the black matrix block BM2 facing toward the array substrate 10. The specific functional and structural details of the array substrate 10 refer to the descriptions of the aforementioned embodiments, and thus will be not described in detail herein. In particular, a projection of the black matrix block BM2 on the array substrate 10 covers all regions on the array substrate except for the pixel electrode PE and covers the black light-shading layer on the array substrate. More specifically, the black matrix block BM2 for example same as the black light-shading blocks BM1, is made of the black opaque insulating material; and the black opaque insulating material for example a black photoresist containing carbon black. As shown in FIG. 3A, the projection of the black matrix block BM2 on the substrate GS1 of the array substrate 10 for example completely covers the shielding metals SM, the black light-shading blocks BM1 and the data line DL and further cover a partial area of the pixel electrodes PE. As shown in FIG. 3B, the projection of the black matrix block BM2 on the substrate GS1 of the array substrate 10 for example further completely covers respective components of the active switching element T, i.e., the gate electrode G, the semiconductor layer SC, the ohmic contact layer C, the source electrode S and the drain electrode D. The sealant SD for example is disposed surrounding/enclosing the liquid crystal layer LC, so that liquid crystal molecules of the liquid crystal layer LC may be sealed in a certain region. The photo spacers PS for example are evenly distributed among the liquid crystal molecules of the liquid crystal layer LC, so that they can support top and bottom substrates to maintain a certain gap therebetween. The common electrode layer CE may be cooperative with the pixel electrodes PE on the array substrate 10 to form a required electric field when a suitable voltage is applied, so as to drive rotations of the liquid crystal molecules in the liquid crystal layer LC between the common electrode layer CE and the pixel electrode PE and thereby realize the display of required image. The common electrode layer CE for example is made of a transparent electrically-conductive metal material such as an ITO film.

Sum up, the foregoing embodiments of the disclosures, on the basis of ensuring transmittance of product, dispose the black light-shading blocks BM1 below the shielding metals SM, the gate electrode G and the scan line GL, which can solve the misplacement phenomenon caused by very easily occurred misalignment between the array substrate 10 and the counter substrate when being assembled into the liquid crystal display panel 20, such misplacement phenomenon for example is the left border or the right border of the black matrix block BM2 as shown in FIG. 3A being misplaced to the top of the shielding metal SM even being misplaced to the top of the gap between the shielding metal SM and the data line DL so that light leakage phenomenon is occurred at two sides of the data line DL, or is the misplacement of the black matrix block BM2 as shown in FIG. 3B resulting in the light leakage phenomenon occurred at two sides of the gate electrode G as well as the scan line GL (not shown in FIG. 3B).

Figure 4A:
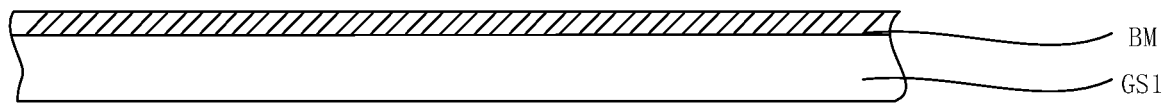
FIG. 4A through FIG. 4H are schematic views of a manufacturing process associated with a first metal layer and a black shading layer according to an embodiment of the disclosure.
Figure 4B:
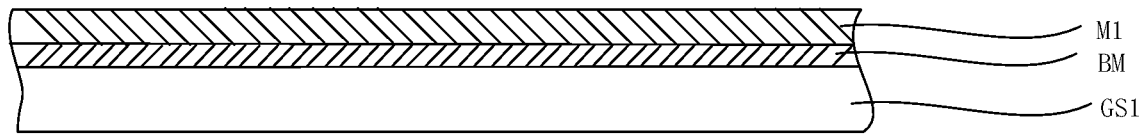
Figure 4C:
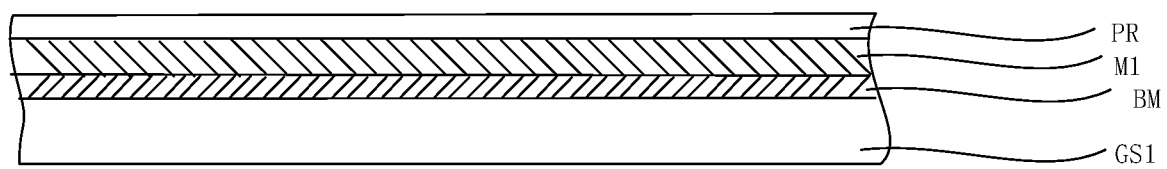
Figure 4D:
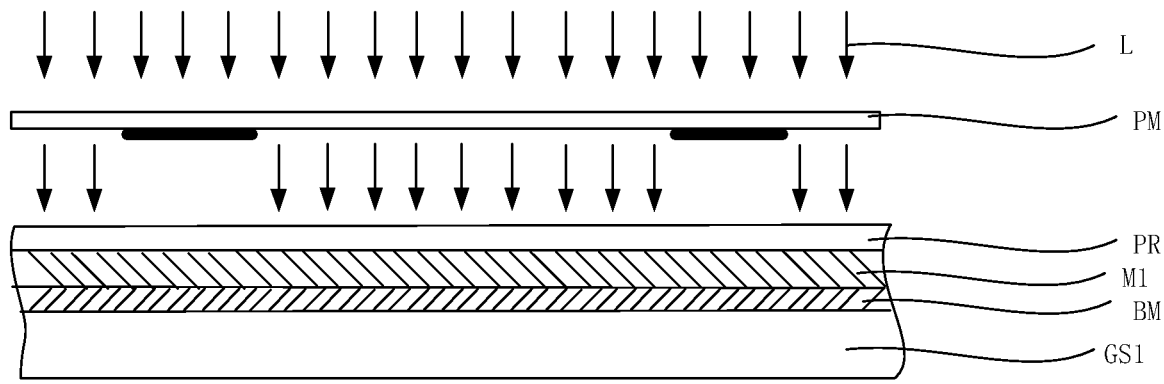
Figure 4E:
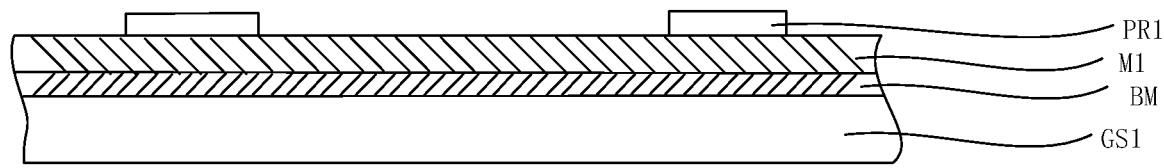
Figure 4F:
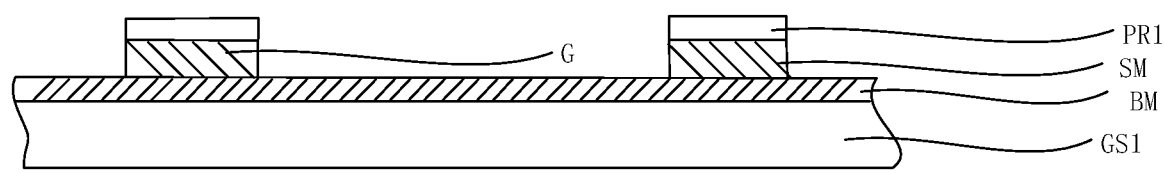
Figure 4G:
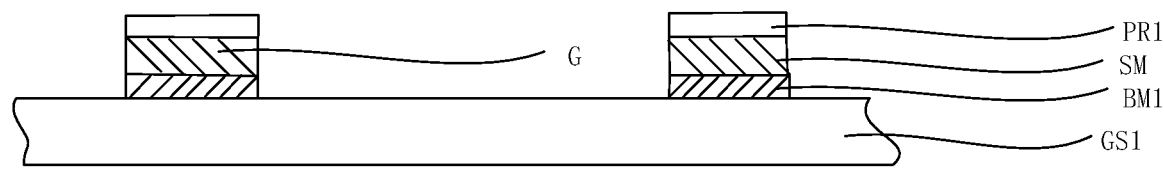
Figure 4H:
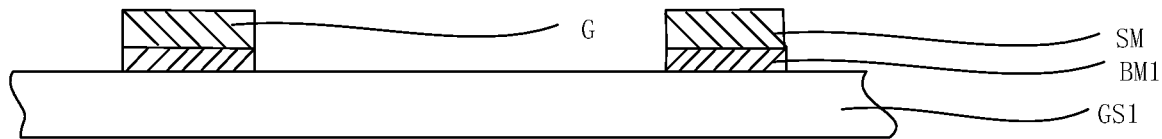

Another embodiment of the disclosure provides a manufacturing method of the array substrate 10 as described in any one of the foregoing embodiments. Referring to FIGS. 2A and 2B, the manufacturing method includes: forming the black light-shading block BM1, the gate electrode G of the active switching element T, the shielding metal SM and the scan line GL connected with the gate electrode G on the substrate GS1 by using a same masking process. In particular, the step of forming the black light-shading block BM1, the gate electrode G of the active switching element T, the shielding metal SM and the scan line GL connected with the gate electrode G on the substrate GS1 by using a same masking process includes that: as shown in FIG. 4A, a black light-shading material layer BM firstly is formed on the substrate GS1; as shown in FIG. 4B, a metal material layer M1 subsequently is formed on the black light-shading material layer BM by a PVD (physical vapor deposition, such as evaporation, sputtering, etc.) method, so that the black light-shading material layer BM is located between the substrate GS1 and the metal material layer M1; as shown in FIG. 4C, a photoresist material layer PR afterwards is formed on the metal material layer M1; as shown in FIG. 4D, a photomask PM and light illumination L then are used to perform exposure and developing onto the photoresist material layer PR to obtain the patterned photoresist material layer PR1 as shown in FIG. 4E; as shown in FIG. 4F and FIG. 4G, the patterned photoresist material layer PR1 is used as a mask to sequentially perform a wet etching and a dry etching respectively on the metal material layer M1 and the black light-shading material layer BM; and as shown in FIG. 4H, the residual photoresist material layer PR1 is removed after the dry etching to obtain the black light-shading block BM1, the gate electrode G of the active switching element T, the shielding metal SM and the scan line GL (not shown) connected with the gate electrode G.

Moreover, referring to FIGS. 2A and 2B, the manufacturing method of the array substrate 10 for example further includes: forming an active material layer AS on the layer structure where the gate electrode G of the active switching element T, the shielding metal SM, and the scan line GL connected with the gate electrode G are located. In particular, the formation of the active material layer AS is that: forming a gate insulating layer GI on the layer structure where the gate electrode G of the active switching element T, the shielding metal SM and the scan line GL connected with the gate electrode G are located by for example a PECVD (plasma enhanced chemical vapor deposition) method; and then forming the semiconductor layer SC and the ohmic contact layer C on the gate insulating layer GI above the gate electrode G of the active switching element T by a PECVD method.

Furthermore, referring to FIGS. 2A and 2B, the manufacturing method of the array substrate 10 for example even further includes: forming the source electrode S of the active switching element T, the drain electrode D of the active switching element T and the data line DL connected with the source electrode S in a layer structure on the active material layer AS by for example a PVD method.

Moreover, referring to FIGS. 2A and 2B, the manufacturing method of the array substrate 10 for example still even further includes: forming a passivation layer PV in a layer structure on the source electrode S of the active switching element T, the drain electrode D of the active switching element T and the data line DL connected with the source electrode S by for example a PECVD method and forming the contact hole CH in the passivation layer PV.

Furthermore, referring to FIGS. 2A and 2B, the manufacturing method of the array substrate 10 for example still further includes: a color filter layer including color filter blocks CR of multiple colors as per a predetermined order in the layer structure on the passivation layer PV. In particular, the color filter blocks CR each are one of a red filter block CR, a green filter block CR and a blue filter block CR, and the predetermined order for example is firstly forming all red filter blocks CR, then forming all the green filter blocks CR and finally forming all the blue filter CR, or other order instead.

In addition, referring to FIGS. 2A and 2B, the manufacturing method of the array substrate 10 for example even still further includes: forming multiple pixel electrodes PE in a layer structure on the color filter layer corresponding to the color filter blocks CR in one-to-one manner by for example a PVD method, and making the pixel electrodes PE each connect to the drain electrode D of corresponding active switching element T through the contact hole CH.

More specifically, the formation of the shielding metal SM on the substrate GS1 for example is that: the shielding metal SM is formed surrounding the pixel electrode PE, being partially overlapped with two edge portions (left and right edges as shown in FIG. 1) of the pixel electrode PE parallel to the data line DL to form a storage capacitor, and having a gap with respect to the data line DL in the direction (horizontal direction in FIG. 1) perpendicular to the data line DL.

Still another embodiment of the disclosure provides a manufacturing method of the liquid crystal display panel 20 as described in any one of the foregoing embodiments. Referring to FIGS. 3A and 3B, the manufacturing method includes: preparing the array substrate 10 by using the manufacturing method of the array substrate 10 as described in any one of the foregoing embodiments, detailed steps of the manufacturing method of the array substrate 10 refer to the descriptions of the foregoing embodiments and thus will not be repeated herein; sequentially forming a black matrix block BM2 and a common electrode layer CE on the substrate GS2; and forming the photo spacers PS and the sealant SD between the common electrode CE and the array substrate 10 and injecting the liquid crystal layer LC. As a result, the liquid crystal display panel 20 is prepared.

In summary, the foregoing embodiments of the disclosure use a same masking process to form the black light-shading blocks BM1, the gate electrode G of the active switching element T, the shielding metal SM and the scan line GL on the substrate GS1, on the prerequisite of without increasing photomask and simplifying manufacture complexity, which realizes the manufacture of the black light-shading blocks BM1 and omits an aligning process between the black light-shading blocks BM1 and the gate electrode G of the active switching element T, the shielding metal SM as well as the scan line GL in the layer structure thereon. Meanwhile, on the basis of ensuring transmittance of product, the black light-shading blocks BM1 finally are disposed below the shielding metal SM, below the gate electrode G and below the scan line GL, which can solve the misplacement phenomenon caused by very easily occurred misalignment between the array substrate 10 and the counter substrate when being assembled into the liquid crystal display panel 10, such misplacement phenomenon for example is the left border or the right border of the black matrix block BM2 as shown in FIG. 3A being misplaced to the top of the shielding metal SM even being misplaced to the top of the gap between the shielding metal SM and the data line DL so that the light leakage phenomenon would be occurred at two sides of the data line DL, or is the misplacement of the black matrix block BM2 as shown in FIG. 3B resulting in the light leakage phenomenon occurred at the left and right sides of the gate electrode G as well as the scan line GL (not shown in FIG. 3B).

In the several embodiments provided by the disclosure, it should be understood that the described systems, devices and/or methods can be realized in other ways. For example, the embodiments of devices described above are merely illustrative. For example, division of units is only a logical functional division, and other division manner may be adopted in actual implementation, for example multiple units or components can be combined together or integrated into another system, or some features can be omitted or not implemented. In addition, the coupling or direct coupling or communication connection shown or discussed may be indirect coupling or communication connection through some interfaces, devices or units, which may be electrical, mechanical or otherwise.

The units described as separation parts may or may not be physically separated, and the parts shown as units may or may not be physical units, i.e., may be located in one place or distributed over multiple network units. Some or all of the units can be selected according to actual needs to achieve the purpose of the embodiments of the disclosure.

In addition, each of the functional units in the embodiments of the disclosure may be integrated in one processing unit, or each of the units may exist alone physically, or two or more units may be integrated in one unit. The integrated unit can be implemented in the form of hardware or in the form of hardware plus a software functional unit(s).

Finally, it should be noted that the above embodiments are merely illustrative of technical solutions of the disclosure and are not intended to be limiting thereof. Although the disclosure is described in detail with reference to the foregoing embodiments, a person skilled in the art should be understood that the technical solutions described in the foregoing embodiments can be modified or some of technical features can be equivalently replaced, and these modifications or replacements do not depart from the spirit and scope of the technical solutions of various embodiments of the disclosure.

What is claimed is:

1. A liquid crystal display panel comprising:
   an array substrate;
   a counter substrate, disposed opposite to the array substrate;
   a liquid crystal layer, disposed between the array substrate and the counter substrate;
   a sealant, disposed between the array substrate and the counter substrate and enclosing the liquid crystal layer;
   wherein the counter substrate comprises:
      a second substrate;
      a black matrix layer, disposed at a side of the second substrate facing towards the array substrate; and
      a common electrode layer, disposed at a side of the black matrix layer facing towards the array substrate;
   wherein the array substrate comprises:
      a substrate;
      a black light-shading layer, disposed on the substrate;
      a first metal layer, correspondingly disposed on the black light-shading layer, wherein the black light-shading layer is located between the substrate and the first metal layer;
      an active material layer, disposed on the first metal layer;
      a second metal layer, disposed on the active material layer;
      a passivation layer, disposed on the second metal layer and with a contact hole;
      a color filter layer, disposed on the passivation layer; and
      a pixel electrode layer, disposed on the color filter layer and connected to the second metal layer through the contact hole;
   wherein the first metal layer comprises a gate electrode of an active switching element and a shielding metal for forming a storage capacitor with the pixel electrode layer;
   wherein the active material layer comprises a gate insulating layer, a semiconductor layer and an ohmic contact layer of the active switching element; the gate insulating layer, the semiconductor layer and the ohmic contact layer are sequentially stacked in that order;
   wherein the second metal layer comprises a source electrode of the active switching element, a drain electrode of the active switching element connected to the pixel electrode layer, and a data line connected to the source electrode;
   wherein viewed from a cross-sectional view taken along a first direction perpendicular to the data line, a projection of the black matrix layer on the substrate of the array substrate completely covers the shielding metal, the black light-shading layer and the data line and further cover a partial area of the pixel electrode layer; and
   wherein viewed from another cross-sectional view taken along a second direction intersecting the first direction, a projection of the black matrix layer on the substrate of the array substrate completely covers the gate electrode, the semiconductor layer, the ohmic contact layer, the source electrode and the drain electrode.

2. The liquid crystal display panel as claimed in claim 1, wherein the color filter layer comprises a red filter block, a green filter block and a blue filter block; and the pixel electrode layer comprises a plurality of pixel electrodes made of a transparent electrically-conductive material, and the pixel electrodes are corresponding to the red filter block, the green filter block and the blue filter block in one-to-one manner.

3. The liquid crystal display panel as claimed in claim 2, wherein the shielding metal disposed surrounding the pixel electrode and being partially overlapped with two edge portions of the pixel electrode parallel to the data line, and the shielding metal and the data line have a gap existed therebetween in a direction perpendicular to the data line.

4. The liquid crystal display panel as claimed in claim 1, wherein a material of the black light-shading layer is a black photoresist containing carbon black.

5. The liquid crystal display panel as claimed in claim 1, wherein a material of the black light-shading layer is same as a material of the black matrix layer.

* * * * *